(12) United States Patent
Bedell et al.

(10) Patent No.: US 9,548,235 B1
(45) Date of Patent: Jan. 17, 2017

(54) METHODS TO REDUCE DEBONDING FORCES ON FLEXIBLE SEMICONDUCTOR FILMS DISPOSED ON VAPOR-RELEASING ADHESIVES

(71) Applicant: International Business Machines Corporation, Armonk, NY (US)

(72) Inventors: Stephen W. Bedell, Wappingers Falls, NY (US); Devendra K. Sadana, Pleasantville, NY (US); Katherine L. Saenger, Ossining, NY (US); Abdelmajid Salhi, Riyadh (SA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/144,171

(22) Filed: May 2, 2016

Related U.S. Application Data

(62) Division of application No. 14/795,216, filed on Jul. 9, 2015.

(51) Int. Cl.
*H01L 21/683* (2006.01)
*H01L 29/20* (2006.01)
(Continued)

(52) U.S. Cl.
CPC ..... *H01L 21/6835* (2013.01); *H01L 21/02532* (2013.01); *H01L 21/02538* (2013.01); *H01L 21/304* (2013.01); *H01L 21/324* (2013.01); *H01L 21/32051* (2013.01); *H01L 21/6836* (2013.01); *H01L 29/161* (2013.01);
(Continued)

(58) Field of Classification Search
CPC ......... B81C 2201/019; B81C 2201/0197; B81C 2201/0128; B81C 2201/013; B81C 2201/0146; B81C 2201/0147; B81C 2201/0163; B81C 2201/017; B81C 1/00777; B81C 1/00825; B81C 1/00833; H01L 21/32051; H01L 21/6835; H01L 21/6836; H01L 29/161; H01L 29/20; H01L 2221/68381
See application file for complete search history.

(56) References Cited

U.S. PATENT DOCUMENTS 7,131,628 B2  11/2006  Feinberg et al.
8,129,257 B2  3/2012  Liang
(Continued)

OTHER PUBLICATIONS

Liang, D. et al.; "Highly efficient vertical outgassing channels for low-temperature InP-to-silicon direct wafer bonding on the silicon-on-insulator substrate"; J. Vac. Sci. Technol. B 26(4); Jul./Aug. 2008; American Vacuum Society; pp. 1560-1568.
(Continued)

*Primary Examiner* — Scott B Geyer
(74) *Attorney, Agent, or Firm* — Harrington & Smith; Louis J. Percello

(57) ABSTRACT

A method comprises providing a handle substrate having a front surface and a back surface; providing a layer of flexible semiconductor material having a front surface and a back surface and an at least partially sacrificial backing layer stack on the back surface of the layer of flexible semiconductor material; bonding the front surface of the layer of flexible semiconductor material to the front surface of the handle substrate; removing at least a portion of the at least partially sacrificial backing layer stack from the back surface of the layer of flexible semiconductor material; opening outgassing paths through the layer of flexible semiconductor material; and processing the layer of flexible semiconductor material.

17 Claims, 11 Drawing Sheets

(51) Int. Cl.
    *H01L 29/161*     (2006.01)
    *H01L 21/324*     (2006.01)
    *H01L 21/02*     (2006.01)
    *H01L 21/3205*     (2006.01)
    *H01L 21/304*     (2006.01)

(52) U.S. Cl.
    CPC .... *H01L 29/20* (2013.01); *H01L 2221/68345* (2013.01); *H01L 2221/68381* (2013.01)

(56) References Cited

U.S. PATENT DOCUMENTS

| | | |
|---|---|---|
| 8,222,093 B2 | 7/2012 | Ng |
| 2004/0105291 A1 | 6/2004 | Rumsey |
| 2006/0284247 A1 | 12/2006 | Augustine et al. |
| 2007/0155056 A1 | 7/2007 | Kang et al. |
| 2010/0133683 A1 | 6/2010 | Fillion |
| 2010/0311250 A1 | 12/2010 | Bedell et al. |
| 2012/0119258 A1 | 5/2012 | Liang |
| 2013/0127064 A1 | 5/2013 | Reber |
| 2014/0251548 A1 | 9/2014 | Bedell et al. |

OTHER PUBLICATIONS

"Processing Flexible Glass with a Carrier"; Mar. 9, 2012; IP.com; IPCOM000215753D; whole document (45 pages).

410

415

420

425

METHODS TO REDUCE DEBONDING FORCES ON FLEXIBLE SEMICONDUCTOR FILMS DISPOSED ON VAPOR-RELEASING ADHESIVES

CROSS REFERENCE

This patent application is a divisional application of U.S. patent application Ser. No. 14/795,216, filed Jul. 9, 2015, the disclosure of which is incorporated by reference herein in its entirety.

BACKGROUND

The exemplary embodiments described herein relate generally to semiconductor devices and methods for the fabrication thereof and, more specifically, to methods for reducing adhesive debonding forces between semiconductor layers and substrates in post-bonding processes.

Optoelectronic devices such as solar cells may incorporate flexible semiconductor layers produced by spalling techniques. In these spalling techniques, a stressor layer is generally used to exfoliate a thin, device-quality, semiconductor layer from a parent semiconductor substrate. This process can be repeated multiple times, limited only by the thickness of the substrate. The thin semiconductor layers (which may be flexible) can be difficult to handle and process.

In some cases, spalling may involve the temporary bonding of a flexible semiconductor layer to a (preferably rigid) low-cost handle substrate and subsequent separation of the flexible semiconductor layer from the handle substrate using ultraviolet (UV) releasable tape or polyimide releasable tape. In such spalling techniques, the bonding method should be compatible with semiconductor layer/handle substrate processing at temperatures as high as 200 to 400 degrees C. The bonding temperature is limited by the maximum temperature which can be handled by the tape (maximum temperature of about 90 degrees C. for UV tape and about 200 degrees C. for polyimide tape) contacting the stressor layer used for spalling.

Bonding using an epoxy adhesive is one type of bonding method. However, post-bonding processes at temperatures higher than the curing temperature of the epoxy may lead to both blister formation and adhesion failure between the impermeable flexible film and the epoxy, an effect attributed to epoxy outgassing.

BRIEF SUMMARY

In one exemplary aspect, a method comprises providing a handle substrate having a front surface and a back surface; providing a layer of flexible semiconductor material having a front surface and a back surface and an at least partially sacrificial backing layer stack on the back surface of the layer of flexible semiconductor material; bonding the front surface of the layer of flexible semiconductor material to the front surface of the handle substrate; removing at least a portion of the at least partially sacrificial backing layer stack from the back surface of the layer of flexible semiconductor material; opening outgassing paths through the layer of flexible semiconductor material; and processing the layer of flexible semiconductor material.

In another exemplary aspect, a method comprises providing an at least partially sacrificial backing layer stack on a back surface of a semiconductor layer; disposing a metal adhesion layer on a front surface of the semiconductor layer; bonding the metal adhesion layer to a front surface of a substrate; removing at least a portion of the at least partially sacrificial backing layer stack from the back surface of the semiconductor layer; opening outgassing paths through the semiconductor layer; and processing the semiconductor layer.

In another exemplary aspect, a method comprises providing a stressor layer stack on a back surface of a semiconductor substrate; adhesively bonding a front surface of the semiconductor substrate to a handle substrate using an epoxy adhesive; removing at least a portion of the stressor layer stack from the back surface of the semiconductor substrate; applying a hardmask to the back surface of the semiconductor substrate exposed by removing the at least a portion of the stressor layer stack; forming semiconductor cells in the semiconductor substrate under the hardmask such that the formed semiconductor cells are spaced apart from each other; and allowing the epoxy adhesive to outgas from the spaces defined between the semiconductor cells.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein:

FIG. 6 is a logic flow diagram that illustrates the operation of an exemplary method, and a result of execution of

DETAILED DESCRIPTION

Exemplary embodiments of methods for reducing adhesive debonding forces between semiconductor layers and substrates in post-bonding processes are disclosed herein. Such methods include, but are not limited to, the use of temporary bonding layers comprising epoxies in conjunction with release and/or adhesion layers and spalling techniques. Such methods also include, but are not limited to, removing selective regions of semiconductor layers (and any ancillary layers) to form vent openings for adhesive outgassing. However, it should be understood that the disclosed embodiments are merely illustrative of the claimed methods and that such methods may be embodied in various forms. The methods disclosed herein may be embodied in many different forms and should not be construed as limited to the exemplary embodiments set forth herein.

The spalling techniques used to form the flexible semiconductor layers on the flexible carriers (described in U.S. Patent Application Publication No. 2010/0311250 A1 to Bedell et al.) allow for controlled removal of relatively thin layers of semiconductor materials forming the semiconductor layers from rigid handle substrates to which the semiconductor layers are transferred.

Figure 1A:
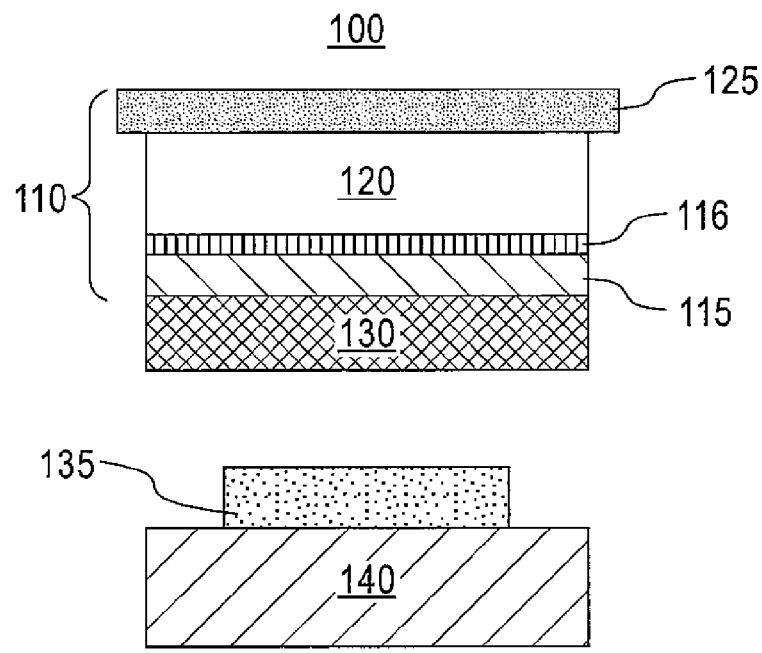
FIGS. 1A through 1D are schematic representations of exemplary methods of bonding a flexible semiconductor to a rigid substrate using an epoxy adhesive.

Referring to FIGS. 1A through 1D, one exemplary method of forming a flexible semiconductor layer on a flexible carrier is shown generally at 100 and is hereinafter referred to as "method 100." As shown in FIG. 1A, a preformed spalled structure is provided, the structure comprising spall-inducing stressor layer stack 110 on a layer of flexible semiconductor material 130. The stressor layer stack 110 may comprise an adhesion layer 115 of titanium (on the flexible semiconductor material 130), a seed layer 116 of nickel on the adhesion layer 115, a stressor layer 120 of nickel deposited onto the seed layer 116, and an ultraviolet (UV) releasable transfer tape 125 applied to the stressor layer 120 to induce the spalling. The flexible semiconductor material 130 has an exposed front surface and a back surface to which the stressor layer stack 110 is bonded. The flexible semiconductor material 130 may be, for example, a 100-oriented silicon material forming a substrate or any material selected from the group consisting of silicon, germanium, SiGe, bulk III-V materials, any of the foregoing materials further including epitaxially grown semiconductor layers, any of the foregoing materials further including doped layers, metallic layers, and/or passivating layers, and combinations of the foregoing. Methods by which the adhesion layer 115 is deposited on the flexible semiconductor material 130 and the seed layer 116 is deposited on the adhesion layer 115 include, but are not limited to, thermal evaporation or sputtering.

An epoxy adhesive 135 is disposed on a rigid handle substrate 140.

Figure 1B:
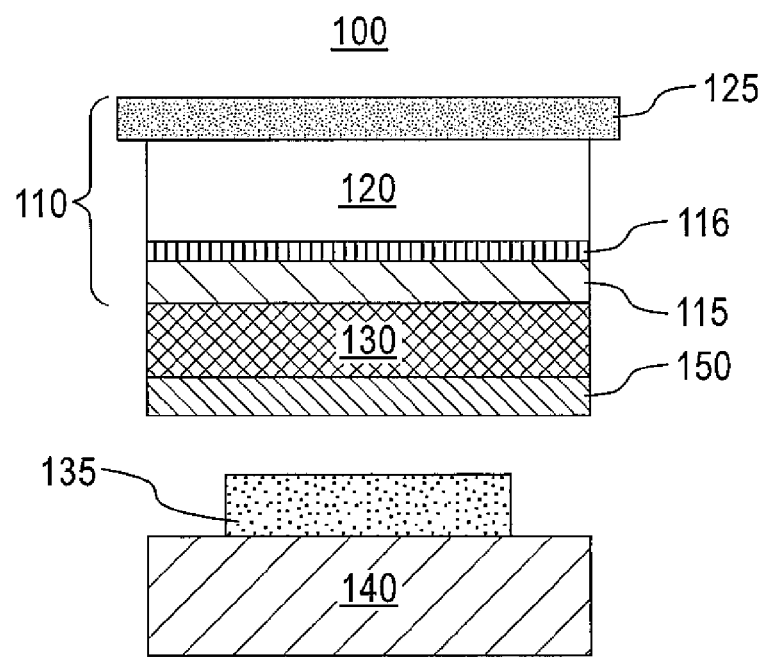

As shown in FIG. 1B, an optional metal adhesion layer (shown at 150) may be formed on the exposed front surface of the flexible semiconductor material 130. In embodiments employing the metal adhesion layer 150, the flexible semiconductor material 130 with the metal adhesion layer 150 is interfacially engaged with the epoxy adhesive 135 on the rigid handle substrate 140 to bond the flexible semiconductor material 130 to the rigid handle substrate 140. When the flexible semiconductor material 130 comprises a silicon or silicon oxide-containing semiconductor material, the metal adhesion layer 150 comprises aluminum. However, while aluminum on a native silicon oxide-containing semiconductor material provides a suitable metal adhesion layer 150, other materials (alone or in combination with aluminum) may be used as well. For example, carbon or hydrocarbon contamination may be introduced to the silicon surface prior to the aluminum deposition. Suitable methods for depositing the aluminum metal adhesion layer 150 onto the flexible semiconductor material 130 include, but are not limited to, thermal evaporation or sputtering. In embodiments not employing the metal adhesion layer 150, the flexible semiconductor material 130 is bonded directly to the rigid handle substrate 140.

Figure 1C:
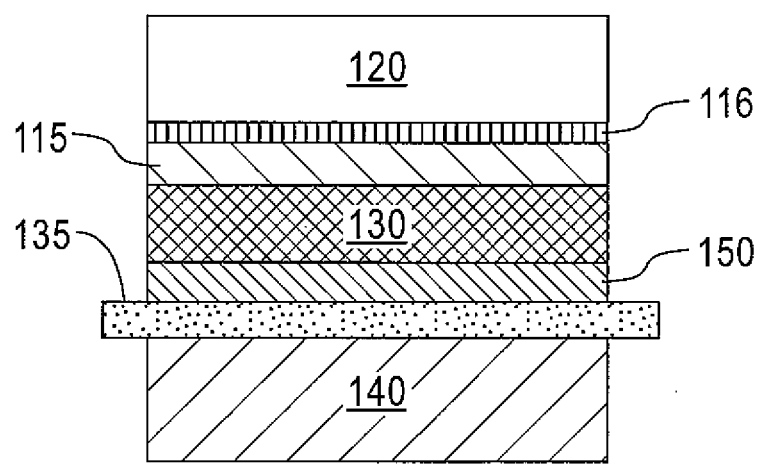

As shown in FIG. 1C, pressure is applied to one or both of the stressor layer stack 110 and the rigid handle substrate 140 such that the epoxy adhesive 135 is substantially uniformly distributed between the metal adhesion layer 150 and the rigid handle substrate 140. The epoxy adhesive is then typically cured at a temperature of from about 40° C. to about 150° C. for a period of time between about 0.1 hours to about 5 hours. The tape 125 is removed from the stressor layer stack 110 after the curing step.

Figure 1D:
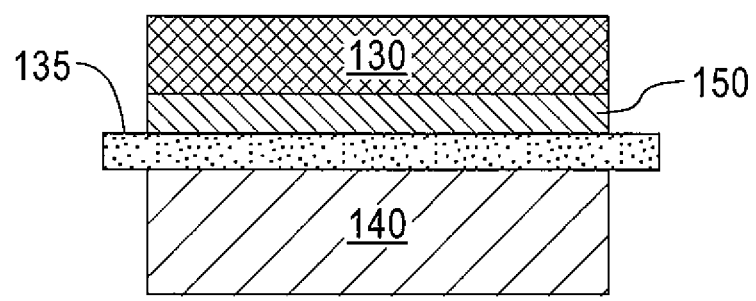

As shown in FIG. 1D, the adhesion layer 115, the seed layer 116, and the stressor layer 120 are removed from the flexible semiconductor material 130. Post-bonding processing steps may be performed on the flexible semiconductor material 130. Such post-bonding processing steps include, but are not limited to, patterning, thermal treatments, film depositions, and the like. Such post-bonding processing steps may be carried out at temperatures of about 150° C. to about 400° C., which are generally higher than the curing temperature of the epoxy adhesive 135.

Figure 1E:
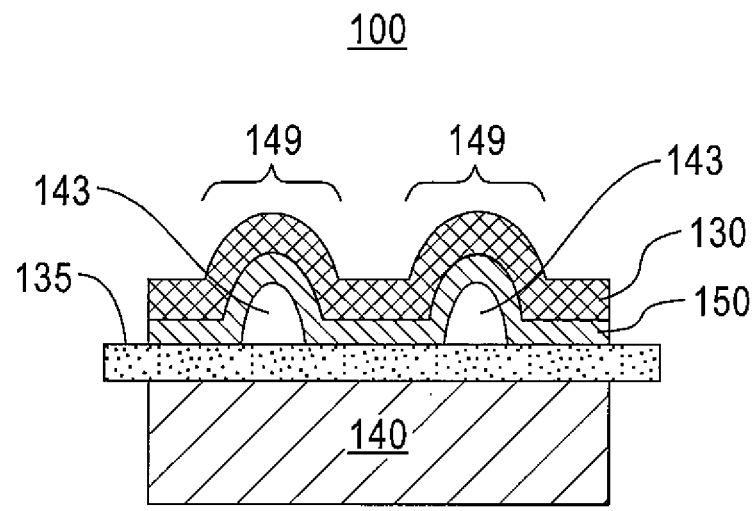
FIGS. 1E and 1F are schematic representations of exemplary debonding forces on flexible semiconductors bonded to rigid substrates using the epoxy adhesive due to outgassing.

As shown in FIG. 1E, upon carrying out the post-bonding processes, outgassing of the epoxy adhesive 135 occurs, thereby forming bubbles 143 between the layer of epoxy adhesive 135 and the metal adhesion layer 150. Such bubbles 143 cause dimples 149 or other discontinuities in the exposed surface of the flexible semiconductor material 130.

Figure 1F:
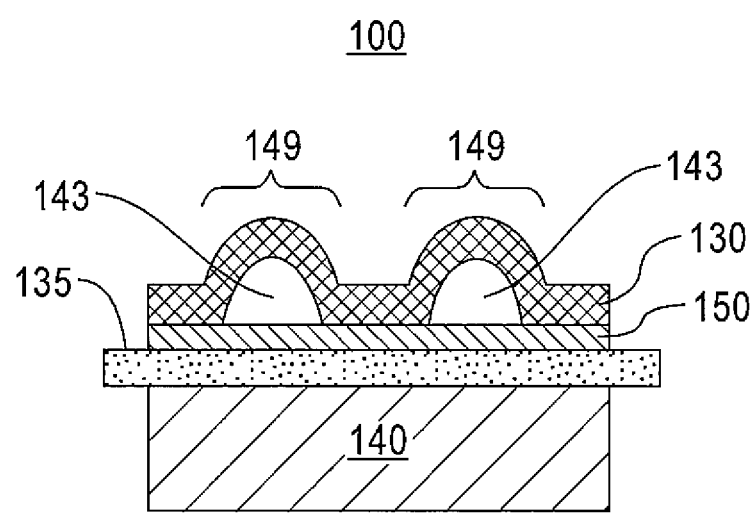

As shown in FIG. 1F, the outgassing of the epoxy adhesive 135 may occur through the metal adhesion layer 150 to cause the bubble 143 to form at the underside of the flexible semiconductor material 130. Such bubbles 143 cause dimples 149 or other discontinuities in the exposed surface of the flexible semiconductor material 130.

Figure 2A:
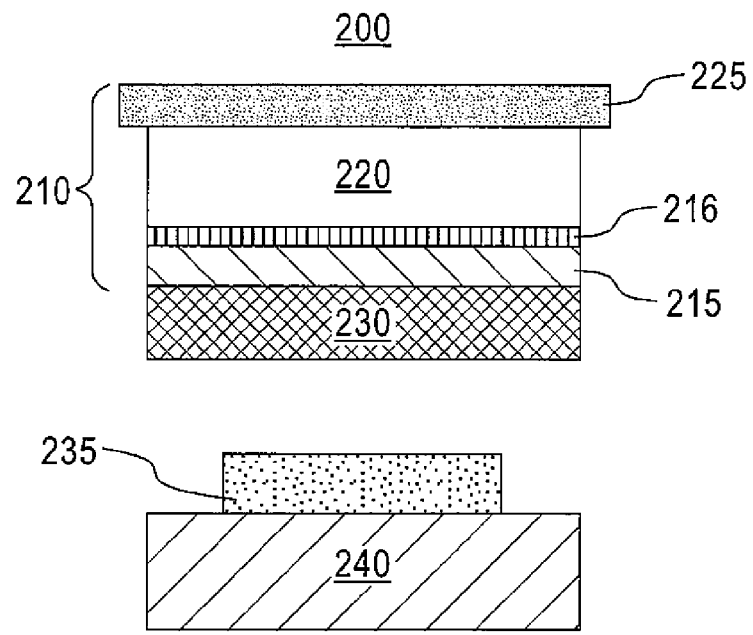
FIGS. 2A through 2D are schematic representations of exemplary methods of bonding a flexible semiconductor to a rigid substrate using an epoxy adhesive.

Referring now to FIGS. 2A through 2D, another exemplary method of forming a flexible semiconductor layer on a flexible carrier is shown generally at 200 and is hereinafter referred to as "method 200." As shown in FIG. 2A, a preformed spalled structure is provided, the structure comprising a spall-inducing stressor layer stack 210 on a layer of flexible semiconductor material 230. The stressor layer stack 210 may comprise an adhesion layer 215 of titanium (on the flexible semiconductor material 230), a seed layer 216 of nickel on the adhesion layer 215, a stressor layer 220 of nickel deposited onto the seed layer 216, and an ultraviolet (UV) releasable transfer tape 225 applied to the stressor layer 120 to induce the spalling. The flexible semiconductor material 230 (which may be the same as or similar to that as described above) has an exposed front surface and a back surface to which the stressor layer stack 210 is bonded. Methods by which the adhesion layer 215 is deposited on the flexible semiconductor material 230 and the seed layer 216 is deposited on the adhesion layer 215 include, but are not limited to, thermal evaporation or sputtering.

An epoxy adhesive 235 is disposed on a rigid handle substrate 240.

Figure 2B:
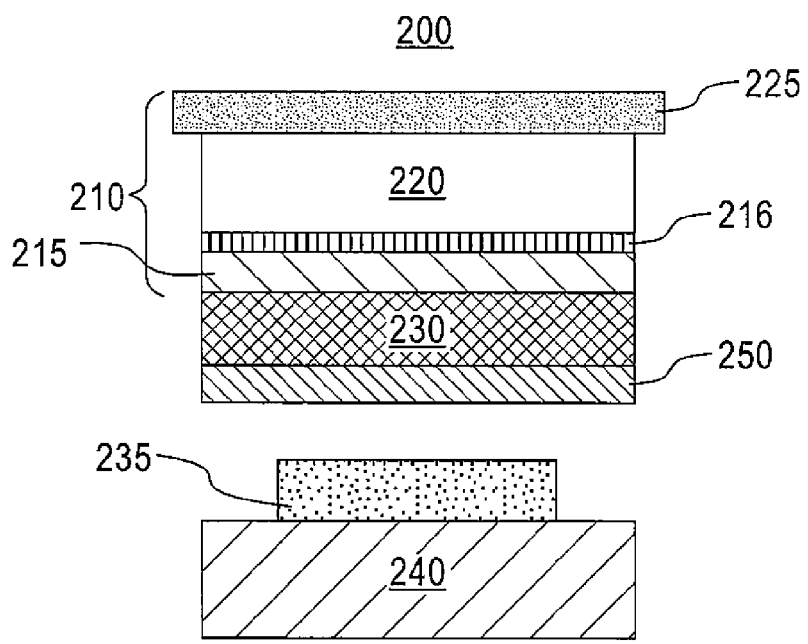

As shown in FIG. 2B, an optional metal adhesion layer (shown at 250) may be formed on the exposed front surface of the flexible semiconductor material 230. In embodiments employing the metal adhesion layer 250, the flexible semiconductor material 230 with the metal adhesion layer 250 is interfacially engaged with the epoxy adhesive 235 on the rigid handle substrate 240 to bond the flexible semiconductor material 230 to the rigid handle substrate 240. When the flexible semiconductor material 230 comprises a silicon or silicon oxide-containing semiconductor material, the metal adhesion layer 250 comprises aluminum. However, while aluminum on a native silicon oxide-containing semiconductor material provides a suitable metal adhesion layer 250, other materials (alone or in combination with aluminum) may be used as well. For example, carbon or hydrocarbon contamination may be introduced to the silicon surface prior to the aluminum deposition. Suitable methods for depositing the aluminum metal adhesion layer 250 onto the flexible semiconductor material 230 include, but are not limited to, thermal evaporation or sputtering. In embodiments not employing the metal adhesion layer 250, the flexible semiconductor material is bonded directly to the rigid handle substrate 240.

Figure 2C:
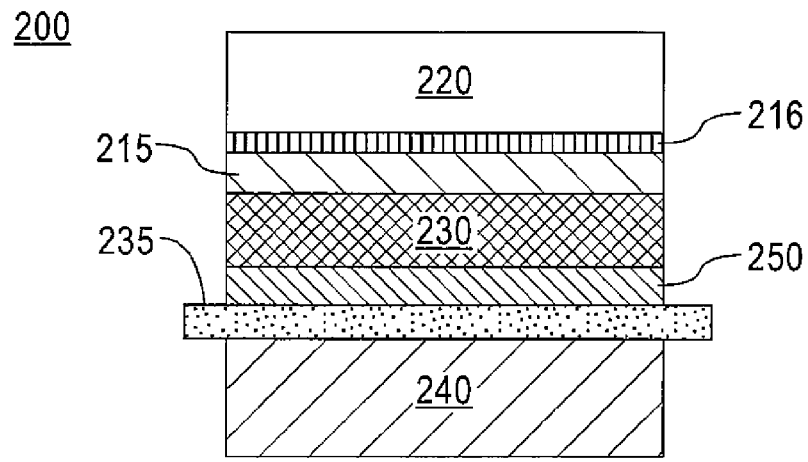

As shown in FIG. 2C, pressure is applied to one or both of the stressor layer stack 210 and the rigid handle substrate 240 such that the epoxy adhesive 235 is substantially uniformly distributed between the metal adhesion layer 250 and the rigid handle substrate 240. The epoxy adhesive is then typically cured at a temperature of from about 40° C. to about 150° C. for a period of time between about 0.1 hours to about 5 hours. The transfer tape 225 is removed from the stressor layer stack 210.

Figure 2D:
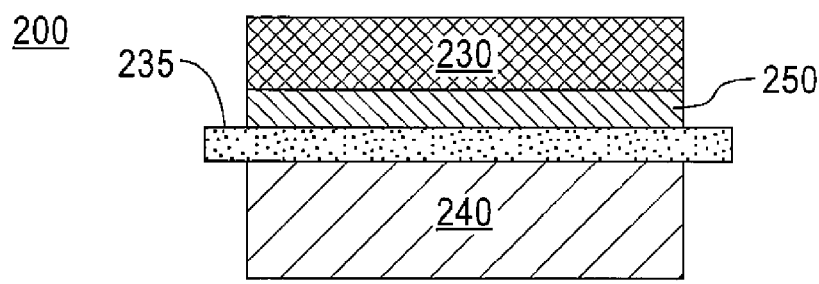

As shown in FIG. 2D, the adhesion layer 215, the seed layer 216, and the stressor layer 220 are removed from the flexible semiconductor material 230. Post-bonding processing steps may be performed on the flexible semiconductor material 230. Such post-bonding processing steps include, but are not limited to, patterning, thermal treatments, film depositions, and the like. Such post-bonding processing steps may be carried out at temperatures of about 150° C. to about 400° C., which are generally higher than the curing temperature of the epoxy adhesive 235.

Figure 2E:
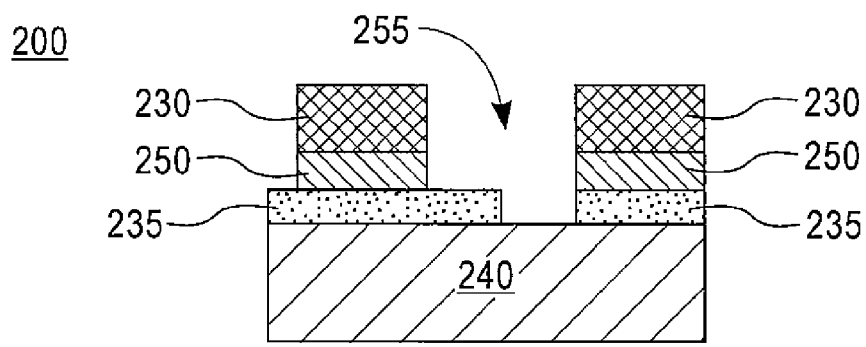
FIG. 2E is a schematic representation of an exemplary method of exposing the epoxy adhesive of FIGS. 2A through 2D to air prior to heating.

As shown in FIG. 2E, selected regions of the flexible semiconductor material 230 and the metal adhesion layer 250 are removed to form vent openings 255 to allow the epoxy adhesive 235 to outgas. Means by which the selected regions of the flexible semiconductor material 230 and the metal adhesion layer 250 may be removed include, but are not limited to, lithography, chemical etching, dry etching, laser ablation, and combinations of the foregoing. As can be seen in FIG. 2E, after removing portions of the flexible semiconductor material 230 and the metal adhesion layer 250, portions of the epoxy adhesive 235 may also be removed, thereby leaving portions of the rigid handle substrate 240 exposed. Both (i) optical lithography followed by chemical etching of the flexible semiconductor material 230 and the metal adhesion layer 250 as well as (ii) laser ablation processes have been found to be suitable methods for allowing the epoxy adhesive to outgas with regard to structures in which the flexible semiconductor material 230 comprises a flexible silicon semiconductor.

Figure 3A:
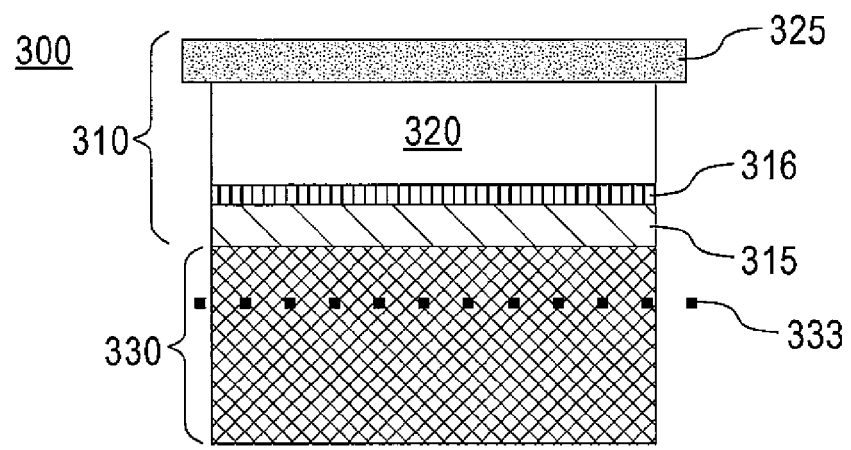
FIGS. 3A through 3E are schematic representations of exemplary methods of forming and bonding a flexible semiconductor layer to a rigid substrate using an epoxy adhesive.

Referring now to FIGS. 3A through 3G, another exemplary method of forming a flexible semiconductor layer on a flexible carrier layer is shown generally at 300 and is hereinafter referred to as "method 300." As shown in FIG. 3A, a spall-inducing stressor layer stack 310 is deposited on a layer of semiconductor material 330. The stressor layer stack 310 may comprise an adhesion layer 315 of titanium (deposited on the semiconductor material 330), a seed layer 316 of nickel on the adhesion layer 315, a stressor layer 320 of nickel deposited onto the seed layer 316, and an ultraviolet (UV) releasable transfer tape 325 applied to the stressor layer 320 to induce the spalling. The semiconductor material 330 (which may be the same as or similar to that as described above) has an exposed front surface and a back surface to which the stressor layer stack 310 is deposited. Methods by which the adhesion layer 315 is deposited on the semiconductor material 330 and the seed layer 316 is deposited on the adhesion layer 315 include, but are not limited to, thermal evaporation or sputtering.

Figure 3B:
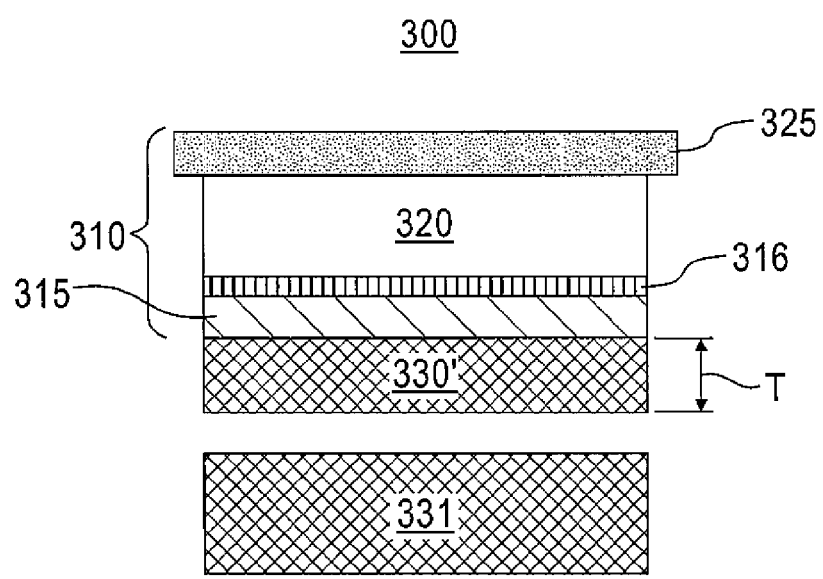

The process of controlled spalling separates semiconductor material 330 at a plane 333 extending longitudinally through the semiconductor material 330 parallel to the adhesion layer 315. Separation of the semiconductor material 330 may be facilitated by mechanically guiding the ultraviolet (UV) releasable transfer tape 325 to induce and sustain spalling mode fracture. Separation along plane 333 results in the semiconductor material 330 having reduced thickness T as shown in FIG. 3B, making the thinner semiconductor material, now shown at 330', have increased flexibility. The lower portion of the semiconductor material (shown at 331) may be discarded or recycled.

Figure 3C:
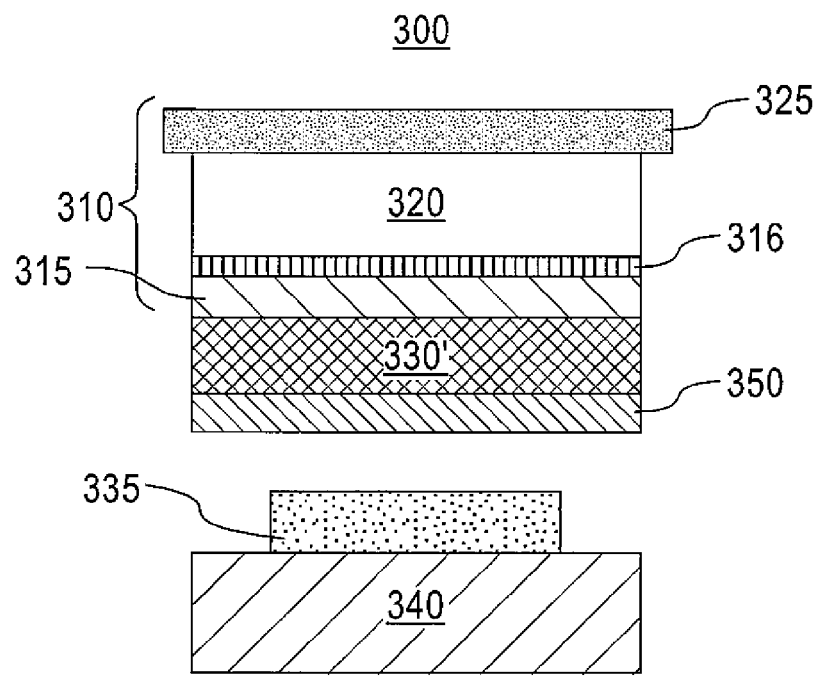

As shown in FIG. 3C, an optional metal adhesion layer (shown at 350) may be formed on the exposed front surface of the now flexible semiconductor material 330' after the spalling. In embodiments employing the metal adhesion layer 350, the flexible semiconductor material 330' with the metal adhesion layer 350 is interfacially engaged with the epoxy adhesive 335 on the rigid handle substrate 340 to bond the flexible semiconductor material 330' to the rigid handle substrate 340. When the flexible semiconductor material 330' comprises a silicon or silicon oxide-containing semiconductor material, the metal adhesion layer 350 comprises aluminum. However, while aluminum on a native silicon oxide-containing semiconductor material provides a suitable metal adhesion layer 350, other materials (alone or in combination with aluminum) may be used as well. For example, carbon or hydrocarbon contamination may be introduced to the silicon surface prior to the aluminum deposition. Suitable methods for depositing the aluminum metal adhesion layer 350 onto the flexible semiconductor material 330' include, but are not limited to, thermal evaporation or sputtering. In embodiments not employing the metal adhesion layer 350, the flexible semiconductor material is bonded directly to the rigid handle substrate 340.

Figure 3D:
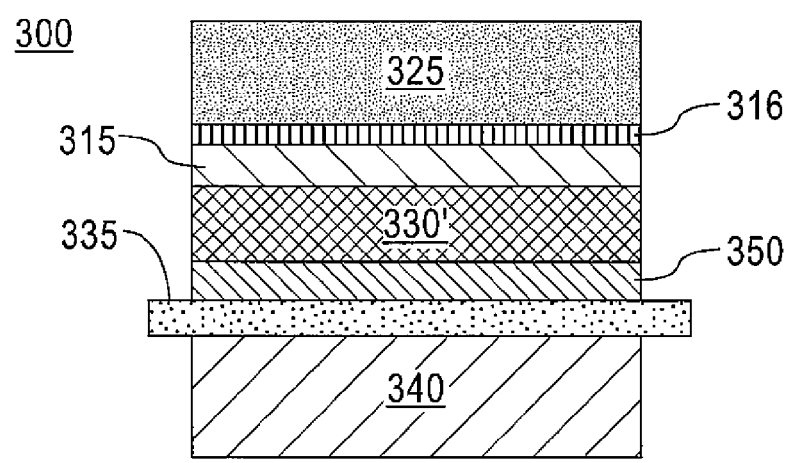

As shown in FIG. 3D, pressure is applied to one or both of the stressor layer stack 310 and the rigid handle substrate 340 such that the epoxy adhesive 335 is substantially uniformly distributed between the metal adhesion layer 350 and the rigid handle substrate 340. The epoxy adhesive is then typically cured at a temperature of from about 40° C. to about 150° C. for a period of time between about 0.1 to about 5 hours. The transfer tape 325 is removed from the stressor layer stack 310.

Figure 3E:
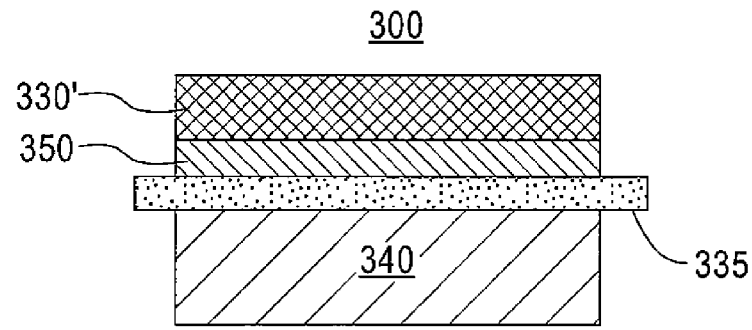

As shown in FIG. 3E, the adhesion layer 315, the seed layer 316, and the stressor layer 320 are removed from the flexible semiconductor material 330'. Post-bonding processing steps may be performed on the flexible semiconductor material 330. Such post-bonding processing steps include, but are not limited to, patterning, thermal treatments, film depositions, and the like. Such post-bonding processing steps may be carried out at temperatures of about 150° C. to about 400° C., which are generally higher than the curing temperature of the epoxy adhesive 335.

Figure 3F:
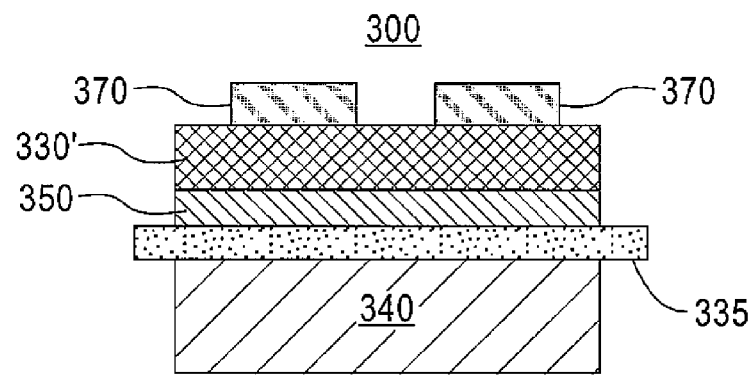
FIGS. 3F and 3G are schematic representations of exposing regions of the epoxy adhesive to air by forming and isolating cells in the flexible semiconductor device of FIGS. 3A through 3E using a masking material.

As shown in FIG. 3F, processing can be provided to include cell isolation (if desired). In one exemplary embodiment of isolating cells in the flexible semiconductor material 330', a hardmask 370 is deposited as a blanket layer on the flexible semiconductor material 330 and is patterned and etched through a photoresist (PR) mask. In another exemplary embodiment of isolating cells also using a patterned hardmask, hardmask material is deposited through a shadow mask. In either embodiment, the hardmask deposition may occur as shown and described here or prior to the application of the stressor layer stack 310. In yet another exemplary embodiment of isolating cells, laser scribing of the flexible semiconductor material 330' may be carried out.

Figure 3G:
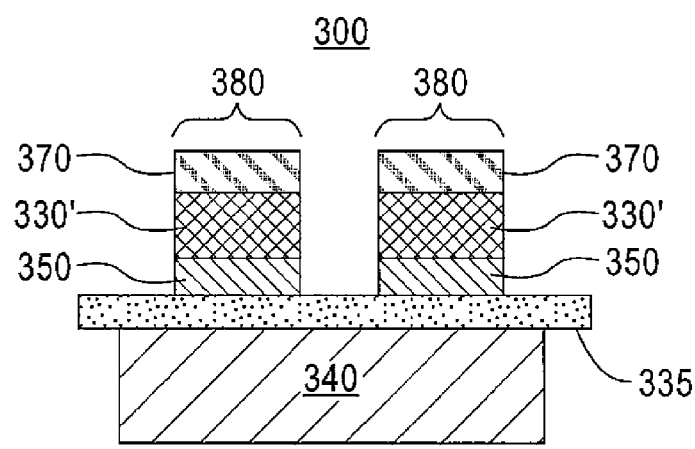

As shown in FIG. 3G, the cells (shown at 380) are isolated from each other and supported by the epoxy adhesive 335.

Figure 3H:
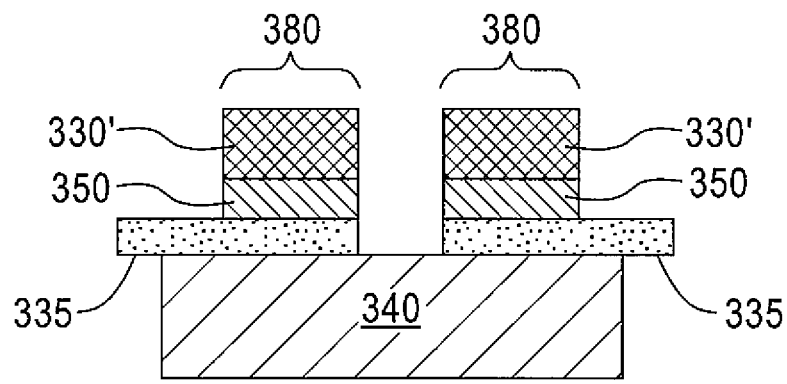
FIG. 3H is a schematic representation of the isolated cells of FIG. 3G with the masking material removed.

As shown in FIG. 3H, one exemplary method of processing the cells 380 is illustrated. In such a method of processing, the hardmask 370 is removed (e.g., by etching). Portions of the epoxy adhesive 335 between cells 380 are also removed by, for example, organic solvents such as ketones, alcohols, or hexanes, dry etching, or laser ablation. Removal of the epoxy adhesive 335 from between the cells 380 allows for the outgassing of the epoxy adhesive 335 under the cells 380.

Figure 3I:
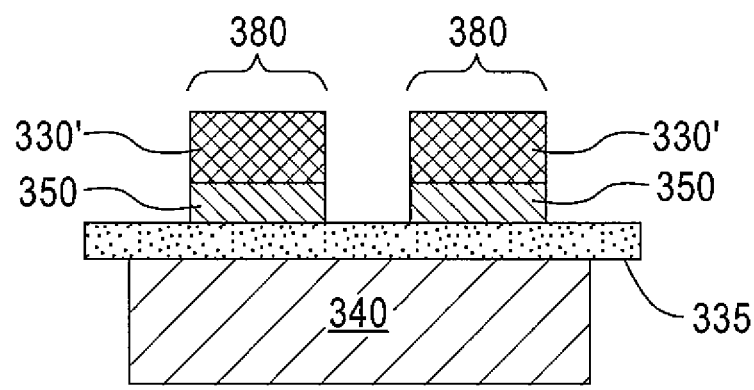
FIG. 3I is a schematic representation of the isolated cells of FIG. 3G with the masking material removed and a portion of the epoxy adhesive removed.

As shown in FIG. 3I, the portions of the epoxy adhesive 335 between the cells 380 may be maintained in place. Outgassing of the exposed epoxy adhesive 335 may occur.

Figure 4A:
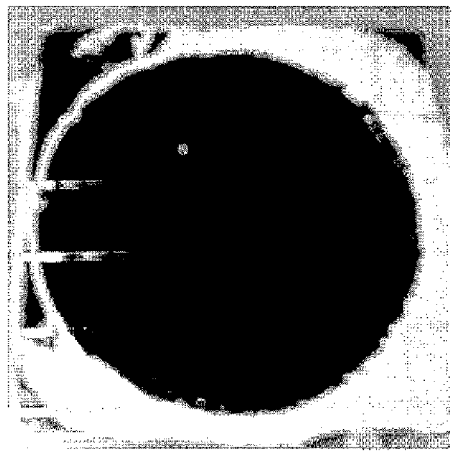
FIG. 4A is a photograph of the bonded silicon material of FIG. 3H before annealing.
Figure 4B:
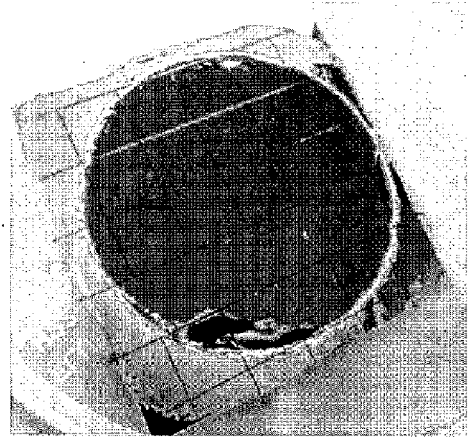
FIG. 4B is a photograph of the bonded silicon material of FIG. 3H after annealing showing blistering.
Figure 4C:
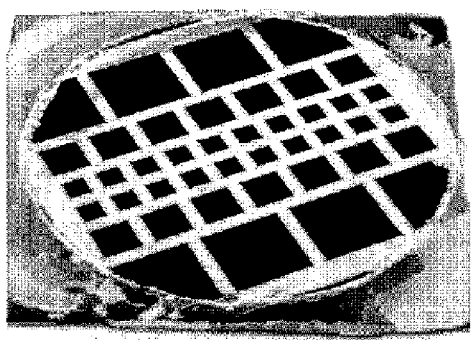
FIG. 4C is a photograph of the patterned silicon material of FIG. 3I before annealing.
Figure 4D:
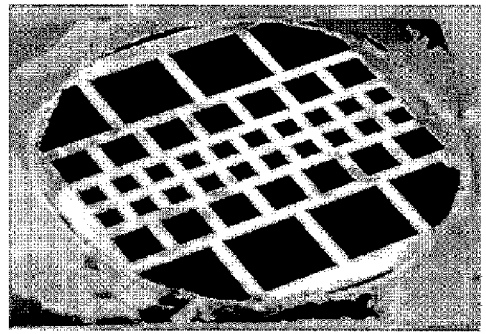
FIG. 4D is a photograph of the patterned silicon material of FIG. 3I after annealing showing the absence of blisters.

As shown in FIGS. 4A through 4D, images of the flexible semiconductor material 330' corresponding to those of FIGS. 3H and 3I are shown. In FIG. 4A, a top view image of the (silicon) flexible semiconductor material 330' with the hardmask 370 removed and portions of the epoxy adhesive 335 between the cells 380 also removed is shown at 410. In FIG. 4B, the same (silicon) flexible semiconductor material 330 is shown at 415 after annealing at 300 degrees C. In FIG. 4C, a top view image of the (silicon) flexible semiconductor material 330' with the hardmask 370 removed and retaining the portions of the epoxy adhesive 335 between the cells 380 is shown at 420. In FIG. 4D, this (silicon) flexible semiconductor material 330' is shown at 425 after annealing at 320 degrees C.

Figure 5:
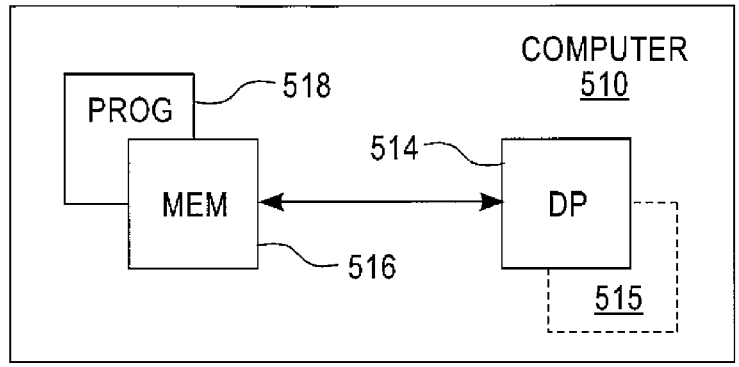
FIG. 5 is a simplified block diagram of exemplary electronic devices that are suitable for use in the fabrication of flexible semiconductor layers and devices on flexible carriers.

As shown in FIG. 5, a simplified block diagram of various electronic devices and apparatuses that are suitable for use in practicing the exemplary embodiments described herein is shown. For example, a computer 510 may be used to control one or more of the fabrication processes as described above. The computer 510 includes a controller, such as a computer or a data processor (DP) 514 and a computer-readable memory medium embodied as a memory (MEM) 516 that stores a program of computer instructions (PROG) 518.

The PROG 518 includes program instructions that, when executed by the associated DP 514, enable the various electronic devices and apparatus to operate in accordance with exemplary embodiments. That is, various exemplary embodiments may be implemented at least in part by computer software executable by the DP 514 of the computer 510, or by hardware, or by a combination of software and hardware (and firmware).

The computer 510 may also include dedicated processors, for example flexible semiconductor modeling processor 515.

The computer readable MEM 516 may be of any type suitable to the local technical environment and may be implemented using any suitable data storage technology, such as semiconductor based memory devices, flash memory, magnetic memory devices and systems, optical memory devices and systems, fixed memory, and removable memory. The DP 514 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the method.

Based on the foregoing it should be apparent that various exemplary embodiments provide a method to fabricate flexible semiconductor layers and devices on flexible carriers.

Figure 6:
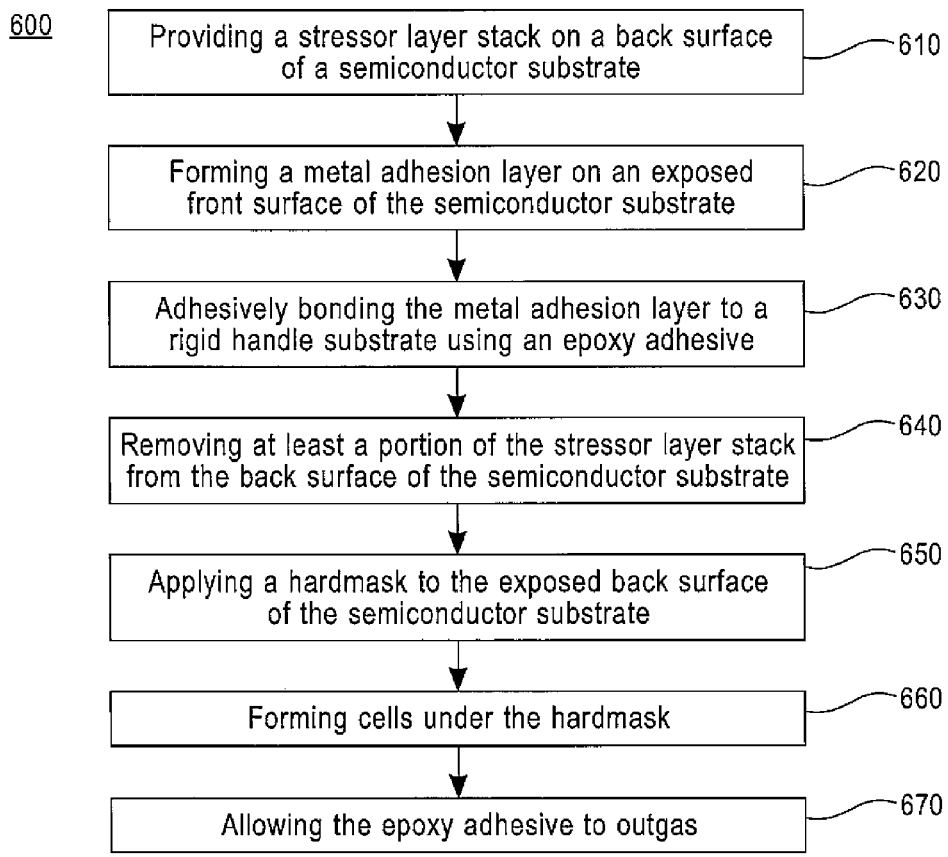

FIG. 6 is a logic flow diagram that illustrates the operation of a method 600 (and a result of an execution of computer program instructions (such as PROG 518)), in accordance with the exemplary embodiments. In accordance with these exemplary embodiments, a preformed spalled structure is provided, the structure comprising a stressor layer stack formed on a back surface of a semiconductor substrate at block 610. An optional metal adhesion layer may be subsequently formed on an exposed front surface of the spalled semiconductor substrate at block 620. At block 630, the metal adhesion layer is then adhesively bonded to a rigid handle substrate using an epoxy. If the metal adhesion layer is not used, the exposed front surface of the semiconductor substrate is bonded to the rigid handle substrate using the epoxy. At least a portion of the stressor layer stack is removed from the back surface of the semiconductor substrate at block 640. At block 650, a hardmask is applied to the exposed back surface of the semiconductor substrate. At block 660, cells are formed under the hardmask by removing portions of the semiconductor substrate and the metal adhesion layer (if present). Portions of the epoxy adhesive not underneath the cells may also be removed. At block 670, outgassing of the epoxy adhesive occurs.

The various blocks of method 600 shown in FIG. 6 may be viewed as method steps, and/or as operations that result from operation of computer program code, and/or as a plurality of coupled logic circuit elements constructed to carry out the associated function(s).

Example

In one example of a method of reducing adhesive debanding forces between semiconductor layers and substrates in post-bonding processes as described in FIGS. 3A through 3I, a preformed spalled structure is provided, the structure comprising a spall-inducing stressor layer stack 310 was on a 100-oriented silicon (Si) substrate (flexible semiconductor material 330). The stressor layer stack 310 comprised an adhesion layer 315 of titanium (Ti) (150 nm) and a seed layer 316 of nickel (Ni) (400 nm), both deposited by sputtering, and a stressor layer 320 of electroplated Ni with a thickness of 5 um on top of the Ni seed layer 316. The Ni was electroplated on a 2 inch diameter area of the Si substrate. A UV releasable tape 325 was then applied to the Ni stressor layer 320 to induce the spalling. After the Si film was spalled, a 300 nm aluminum (Al) metal adhesion layer 350 was thermally evaporated on the spalled Si surface. The Al side of the resulting flexible film assembly (tape/stressor layer/Si/Al) was bonded with epoxy adhesive 335 to a rigid handle substrate 340 which had also been coated with 300 nm of thermally evaporated Al. This metal layer provided a good adhesion with the epoxy adhesive 335. The epoxy adhesive 335 used was an electrically conductive silver filled epoxy (Ablebond 2030SC®, available from Henkel North America). A pressure was applied during the curing process by applying a weight on the top of the sample. The curing temperature was 80 degrees C., with a curing time of 1 hour 15 minutes.

After the curing process was finished, the UV releasable tape 325 was removed by exposure to UV light. The Ni stressor layer 320 and the Ti adhesion layer 315 were removed with selective chemical etchants. A hard mask material (Al was used, although other materials were also suitable for use) was deposited on the exposed semiconductor surface through a shadow mask. The Si was then etched using a reactive ion etching (RIE) process followed by removal of the exposed Al to expose the underlying epoxy adhesive 335. The sample was then heated to 320 degrees C. No blistering or adhesion failure between the Si film and the epoxy adhesive 335 was seen, as shown in FIG. 4B.

The experiment was repeated using a laser scribing process. A grid pattern comprising two orthogonal sets of parallel lines spaced apart by about 10 mm were formed by pulsed laser scribing in an OpTek laser scribing system (available from OpTek Systems Inc., Greenville, S.C., USA) with a stationary laser and moving sample stage using a diode-pumped Q-switched laser (Nd—YVO4, available from Coherent, Inc., Santa Clara, Calif., USA) with output at 532 nm (Matrix 532-8-100, also available from Coherent). The laser had a repetition rate of 60 kHz with a 20 ns pulse width. At the conditions used for scribing (z=1.2 mm focus and 85/35 power/attenuation), the laser pulses had a diameter of about 50 um and a pulse energy of about 95 uJ, corresponding to a fluence per pulse of about 4 J/cm$^2$ and a peak power density of 2e8 W/cm$^2$, and an average power of 5.7 W. At the 20 mm/sec scan rate used, each position along the scribed line was exposed to about 150 laser pulses (=beam size*rep rate/scan rate). After laser scribing, the sample was placed in an oven and the temperature was raised to 300 degrees C. with a step of 20 C degrees every 5 minutes. No blistering was observed for this sample. Different photographs of the sample corresponding to the FIGS. 3H and 3I before and after annealing at 300 degrees C. are shown in FIGS. 4A through 4D.

In one exemplary embodiment, a method comprises providing a handle substrate having a front surface and a back surface; providing a layer of flexible semiconductor material having a front surface and a back surface and an at least partially sacrificial backing layer stack on the back surface of the layer of flexible semiconductor material; bonding the front surface of the layer of flexible semiconductor material to the front surface of the handle substrate; removing at least a portion of the at least partially sacrificial backing layer stack from the back surface of the layer of flexible semiconductor material; opening outgassing paths through the layer of flexible semiconductor material; and processing the layer of flexible semiconductor material.

The method may further comprise disposing a metal adhesion layer on the front surface of the layer of flexible semiconductor material such that the front surface of the layer of flexible semiconductor material is bonded to the front surface of the handle substrate via the metal adhesion layer. The method may further comprise opening the outgassing paths through the metal adhesion layer. The layer of flexible semiconductor material may comprise silicon and the metal adhesion layer may be a thermally evaporated metal layer. The thermally evaporated metal layer may be aluminum. Bonding the front surface of the layer of flexible semiconductor material to the front surface of the handle substrate may comprise applying an epoxy adhesive to at least a portion of the front surface of the handle substrate. The method may further comprise applying pressure to distribute the epoxy adhesive between the layer of flexible semiconductor material and the handle substrate. The layer of flexible semiconductor material may comprise material selected from the group consisting of silicon, germanium, SiGe, bulk III-V materials, epitaxially grown semiconductor layers, any of the foregoing materials having doped layers, any of the foregoing materials having metallic layers, any of the foregoing materials having passivating layers, and combinations of the foregoing materials. The at least partially sacrificial backing layer stack may comprise an adhesion layer disposed on the back surface of the layer of flexible semiconductor material, a seed layer disposed on the adhesion layer, a stressor layer disposed on the seed layer, and a transfer tape disposed on the stressor layer. Processing the layer of flexible semiconductor material may comprise at least one of patterning, thermally treating, and depositing a film on the layer of flexible semiconductor material.

In another exemplary embodiment, a method comprises providing an at least partially sacrificial backing layer stack on a back surface of a semiconductor layer; disposing a metal adhesion layer on a front surface of the semiconductor layer; bonding the metal adhesion layer to a front surface of a substrate; removing at least a portion of the at least partially sacrificial backing layer stack from the back surface of the semiconductor layer; opening outgassing paths through the semiconductor layer; and processing the semiconductor layer.

In the method, bonding the metal adhesion layer to the front surface of the substrate may comprise applying an epoxy adhesive to at least a portion of the front surface of the substrate. The method may further comprise applying pressure to distribute the epoxy adhesive between the front surface of the substrate and the metal adhesion layer. The semiconductor layer may comprise material selected from the group consisting of silicon, germanium, SiGe, bulk III-V materials, epitaxially grown semiconductor layers, any of the foregoing materials having doped layers, any of the foregoing materials having metallic layers, any of the foregoing materials having passivating layers, and combinations of the foregoing materials. The semiconductor layer may comprise silicon and the metal adhesion layer may be a thermally evaporated metal layer.

In another exemplary embodiment, a method comprises providing a stressor layer stack on a back surface of a semiconductor substrate; adhesively bonding a front surface of the semiconductor substrate to a handle substrate using an epoxy adhesive; removing at least a portion of the stressor layer stack from the back surface of the semiconductor substrate; applying a hardmask to the back surface of the semiconductor substrate exposed by removing the at least a portion of the stressor layer stack; forming semiconductor cells in the semiconductor substrate under the hardmask such that the formed semiconductor cells are spaced apart from each other; and allowing the epoxy adhesive to outgas from the spaces defined between the semiconductor cells.

The method may further comprise forming a metal adhesion layer on the front surface of the semiconductor substrate and adhesively bonding the front surface of the semiconductor substrate to the handle substrate via the metal adhesion layer. The method may further comprise allowing the epoxy adhesive to outgas through the metal adhesion layer. The semiconductor substrate may comprise silicon and the metal adhesion layer may be a thermally evaporated metal layer. The thermally evaporated metal layer may be aluminum.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

The invention claimed is:

1. A method, comprising:
   providing an at least partially sacrificial backing layer stack on a back surface of a semiconductor layer;
   controllably spelling the semiconductor layer by separating the semiconductor layer at a plane extending through the semiconductor layer parallel to the at least partially sacrificial backing layer stack;
   disposing a metal adhesion layer on an exposed front surface of the spalled semiconductor layer;
   bonding the metal adhesion layer to a front surface of a substrate by applying an epoxy adhesive to at least one of the metal adhesion layer and the front surface of the substrate;
   applying pressure to distribute the epoxy adhesive between the front surface of the substrate and the metal adhesion layer;
   removing at least a portion of the at least partially sacrificial backing layer stack from the back surface of the semiconductor layer;
   opening outgassing paths through the semiconductor layer; and
   processing the semiconductor layer.

2. The method of claim 1, wherein the semiconductor layer comprises material selected from the group consisting of silicon, germanium, SiGe, bulk III-V materials, epitaxially grown semiconductor layers, any of the foregoing materials having doped layers, any of the foregoing materials having metallic layers, any of the foregoing materials having passivating layers, and combinations of the foregoing materials.

3. The method of claim 1, wherein the at least partially sacrificial backing layer stack comprises an adhesion layer disposed on the back surface of the semiconductor layer, a seed layer disposed on the adhesion layer, a stressor layer disposed on the seed layer, and a transfer tape disposed on the stressor layer.

4. The method of claim 1, wherein processing the semiconductor layer comprises at least one of patterning, thermally treating, and depositing a film on the semiconductor layer.

5. The method of claim 1, wherein controllably spalling the semiconductor layer comprises mechanically guiding a portion of the sacrificial backing layer stack to induce and sustain a spalling mode fracture.

6. A method, comprising:
   providing an at least partially sacrificial backing layer stack on a back surface of a semiconductor layer;
   controllably spalling the semiconductor layer by separating the semiconductor layer at a plane extending through the semiconductor layer parallel to the at least partially sacrificial backing layer stack;
   disposing a metal adhesion layer on a front surface of the semiconductor layer;
   bonding the metal adhesion layer to a front surface of a substrate;
   removing at least a portion of the at least partially sacrificial backing layer stack from the back surface of the semiconductor layer;
   opening outgassing paths through the semiconductor layer; and
   processing the semiconductor layer;
   wherein the semiconductor layer comprises silicon and the metal adhesion layer is a thermally evaporated metal layer.

7. The method of claim 6, wherein the semiconductor layer further comprises material selected from the group consisting of germanium, SiGe, bulk III-V materials, epitaxially grown semiconductor layers, any of the foregoing materials having doped layers, any of the foregoing materials having metallic layers, any of the foregoing materials having passivating layers, and combinations of the foregoing materials.

8. The method of claim 6, wherein the at least partially sacrificial backing layer stack comprises an adhesion layer disposed on the back surface of the semiconductor layer, a seed layer disposed on the adhesion layer, a stressor layer disposed on the seed layer, and a transfer tape disposed on the stressor layer.

9. The method of claim 6, wherein controllably spalling the semiconductor layer comprises mechanically guiding a portion of the sacrificial backing layer stack to induce and sustain a spalling mode fracture.

10. A method, comprising:
    providing a stressor layer stack on a back surface of a semiconductor substrate;
    controllably spalling the semiconductor substrate by separating the semiconductor substrate at a plane extending through the semiconductor substrate parallel to the stressor layer stack;
    forming a metal adhesion layer on a front surface of the semiconductor substrate;
    adhesively bonding the front surface of the semiconductor substrate to the handle substrate via the metal adhesion layer;

removing at least a portion of the stressor layer stack from the back surface of the semiconductor substrate;

applying a hardmask to the back surface of the semiconductor substrate exposed by removing the at least a portion of the stressor layer stack;

forming semiconductor cells in the semiconductor substrate under the hardmask such that the formed semiconductor cells are spaced apart from each other; and allowing the epoxy adhesive to outgas from the spaces defined between the semiconductor cells.

11. The method of claim 10, further comprising allowing the epoxy adhesive to outgas through the metal adhesion layer.

12. The method of claim 10, wherein the semiconductor substrate comprises silicon and the metal adhesion layer is a thermally evaporated metal layer.

13. The method of claim 12, wherein the thermally evaporated metal layer is aluminum.

14. The method of claim 10, wherein the semiconductor substrate comprises material selected from the group consisting of silicon, germanium, SiGe, bulk III-V materials, epitaxially grown semiconductor layers, any of the foregoing materials having doped layers, any of the foregoing materials having metallic layers, any of the foregoing materials having passivating layers, and combinations of the foregoing materials.

15. The method of claim 10, wherein the stressor layer stack comprises an adhesion layer disposed on the back surface of the semiconductor substrate, a seed layer disposed on the adhesion layer, a stressor layer disposed on the seed layer, and a transfer tape disposed on the stressor layer.

16. The method of claim 10, wherein controllably spalling the semiconductor layer comprises mechanically guiding a portion of the stressor layer stack using a transfer tape.

17. The method of claim 16, wherein mechanically guiding a portion of the stressor layer stack comprises inducing and sustaining a spalling mode fracture at the plane extending through the semiconductor substrate parallel to the stressor layer stack.

* * * * *